United States Patent
Fischer et al.

(10) Patent No.: US 6,465,884 B1
(45) Date of Patent: Oct. 15, 2002

(54) SEMICONDUCTOR DEVICE WITH VARIABLE PIN LOCATIONS

(75) Inventors: Frederick H. Fischer; Kenneth D. Fitch; Ho T. Nguyen; Scott A. Segan, all of Allentown, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/578,082

(22) Filed: May 24, 2000

(51) Int. Cl.[7] .................................................. H01L 29/40
(52) U.S. Cl. ........................ 257/734; 257/41; 257/499; 257/203; 257/208
(58) Field of Search .......................... 257/734, 41, 155, 257/160, 499, 202, 203, 204, 208

(56) References Cited

U.S. PATENT DOCUMENTS

| | | | | |
|---|---|---|---|---|
| 5,453,991 A | * | 9/1995 | Suzuki et al. | 371/22.1 |
| 5,922,055 A | * | 7/1999 | Shahar et al. | 365/218 |
| 6,097,988 A | * | 8/2000 | Tobias | 700/23 |

* cited by examiner

Primary Examiner—Jasmine J B Clark
(74) Attorney, Agent, or Firm—Duane Morris LLP (57) ABSTRACT

An semiconductor device including logic circuitry, a plurality of pins, and an interface unit coupling the logic circuitry to the plurality of pins, wherein the interface unit permits any of the pins to be coupled to any portion of the logic circuitry. The semiconductor device provides a template by which many different types of semiconductor devices, with varied pin assignments, can be manufactured, without the need for changing production masks.

12 Claims, 9 Drawing Sheets

SEMICONDUCTOR DEVICE WITH VARIABLE PIN LOCATIONS

FIELD OF THE INVENTION

The present invention relates to semiconductor devices, and in particular, to semiconductor devices with variable pin locations.

DESCRIPTION OF THE RELATED ART

Semiconductor devices (e.g., integrated circuits (ICs)) have wide-reaching and varied uses in the technology industry. Predominantly, semiconductor devices are used as the building blocks for computer processing devices. Semiconductor devices provide the logic by which today's computers organize and process information. They are many different types of semiconductor devices on the market, all of differing size and configuration.

One of the differences between semiconductor devices is the number of terminals, or "pins" that each possesses. As is well known, the pins of an semiconductor device provide terminals by which signals may be fed to, or issued from, the device. Some common types of semiconductor devices may include anywhere from 4 to 1000 pins per device.

Figure 1:
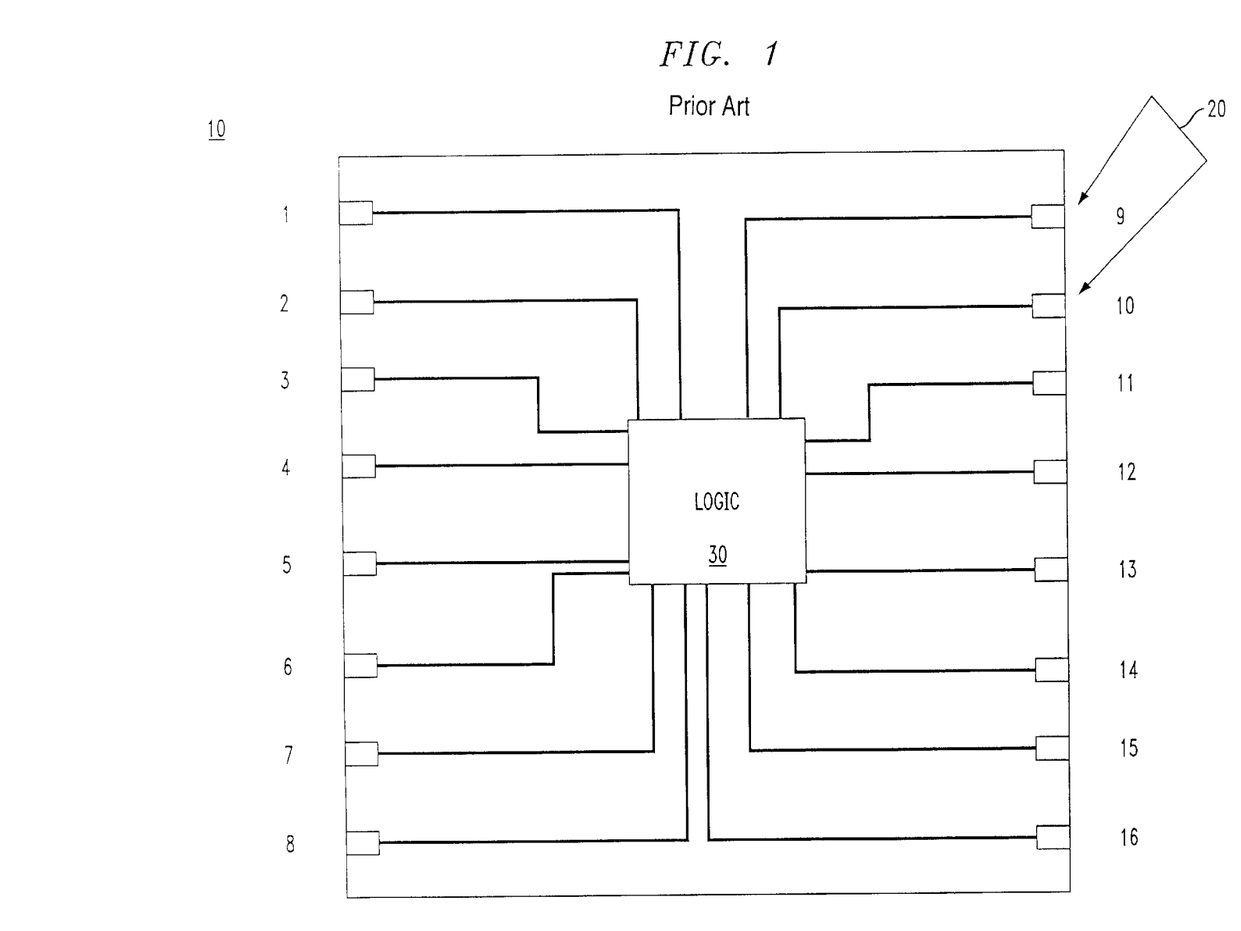
FIG. 1 shows a block diagram of a conventional semiconductor device.

FIG. 1 shows a conventional 16-pin semiconductor device 10. The semiconductor device 10 includes a plurality of pins 20 (labeled 1–16) and logic circuitry 30 coupled to the pins in a specific manner. As is known in the art, the pins 20 are assigned certain functions at the time of manufacture of the device. For instance, in the 16-pin semiconductor device shown in FIG. 1, pins 1–8 may comprise input pins and pins 9–16 may comprise output pins. Of course there are various types of inputs and outputs which may be coupled to the device (e.g., clock signals, operation signals, reset signals, etc.), and each must be coupled to the logic circuitry 30 in a particular manner. More specifically, if pin 8 is a "reset" pin, it must be coupled to the portion of the logic circuitry which controls resetting. In FIG. 1, that portion of the logic circuitry 30 which controls resetting is presumed to be located on the 'south' side of the logic circuitry. However, in some other semiconductor device designs, the resetting circuitry may be disposed on a 'north', a 'west', or an 'east' side of the logic circuitry 30. Thus, as will be understood, it would be beneficial to create an semiconductor device which allows any one of the pins 1–16 to be a "reset" pin.

The physical pin arrangement (e.g., number of pins, pin position) of an semiconductor device is determined at the time the device is manufactured, and will remain fixed regardless of the package types in which the device is enclosed. Thus, a complete and expensive new mask set will be needed each time the pin arrangement is altered.

As stated above, a problem associated with the current techniques for manufacturing semiconductor devices is that each time a new device type (with a different pin arrangement scheme) is produced, the "masks" which are used to produce the device must be changed. Often times, ten (10) or more masks must be used each time a new semiconductor device is manufactured. The changing of masks adds considerably to the time and costs associated with device production.

Therefore, there is currently a need for an semiconductor device design which allows pin assignments to be varied, without the need for changing masks.

SUMMARY OF THE INVENTION

The present invention is an semiconductor device including logic circuitry, a plurality of pins, and an interface unit coupling the logic circuitry to the plurality of pins, wherein the interface unit permits any of the pins to be coupled to any portion of the logic circuitry.

The above and other advantages and features of the present invention will be better understood from the following detailed description of the preferred embodiments of the invention which is provided in connection with the accompanying drawings.

DETAILED DESCRIPTION

The present invention is a generic semiconductor device design. The pin arrangement of the generic semiconductor device can be customized and configured so that many different semiconductor devices can be produced from the same generic device design, thus eliminating the need to change production masks each time a new device is produced.

Figure 2:
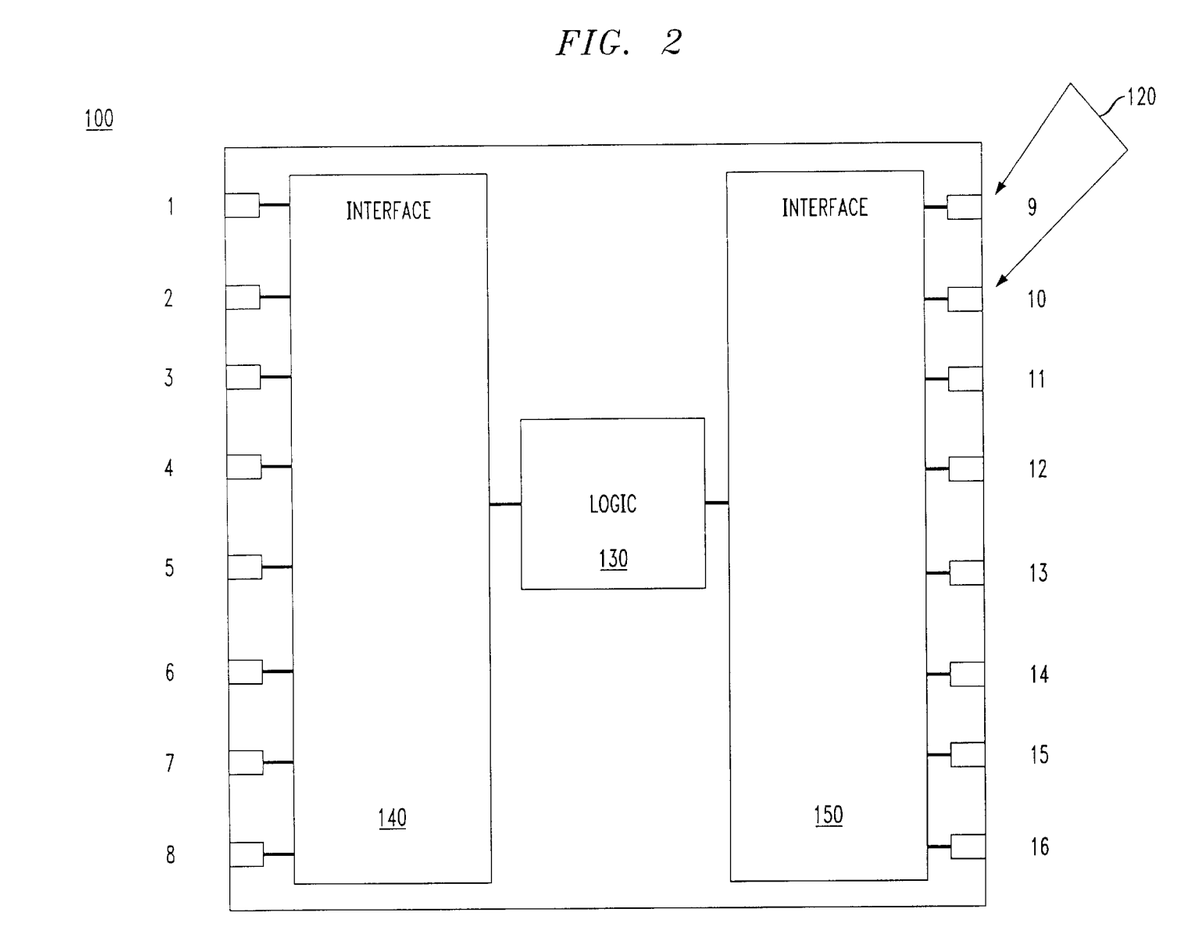
FIG. 2 shows a block diagram of an semiconductor device according to an exemplary embodiment of the present invention.

Referring to FIG. 2, there is shown an semiconductor device 100 (e.g., integrated circuit (IC)) according to an exemplary embodiment of the present invention. The semiconductor device 100 includes a plurality (sixteen in the exemplary figure) of pins 120 (labeled 1–16) and logic circuitry 130 coupled to the pins through interface circuits 140, 150. The interface circuits 140, 150 allow any one of the pins 1–16 to be assigned any function. Thus, the functions of the pins are not set at the time of manufacture as with the conventional semiconductor device 10 shown in FIG. 1. Therefore, the semiconductor device 100 can be used as a template to produced many different kinds of devices. For example, a first type of semiconductor device may have its "reset" pin located at pin 10, and a second type of semiconductor device may have its "reset" pin located at pin 5 (based on the different positions of the resetting circuitry in the logic circuitry 130). With the present semiconductor device 100, both the first and second types of semiconductor devices can be produced, without the need for changing production masks. In particular, the interface circuits 140, 150 allow the "reset" pin to be coupled to the resetting circuitry in the logic circuitry 130 no matter where each is located on the device. Each of the interface circuits 140, 150 preferably include configurable buffer circuits 200, star cell switches 300, and coupling circuits 500 as described in detail below.

Figure 3:
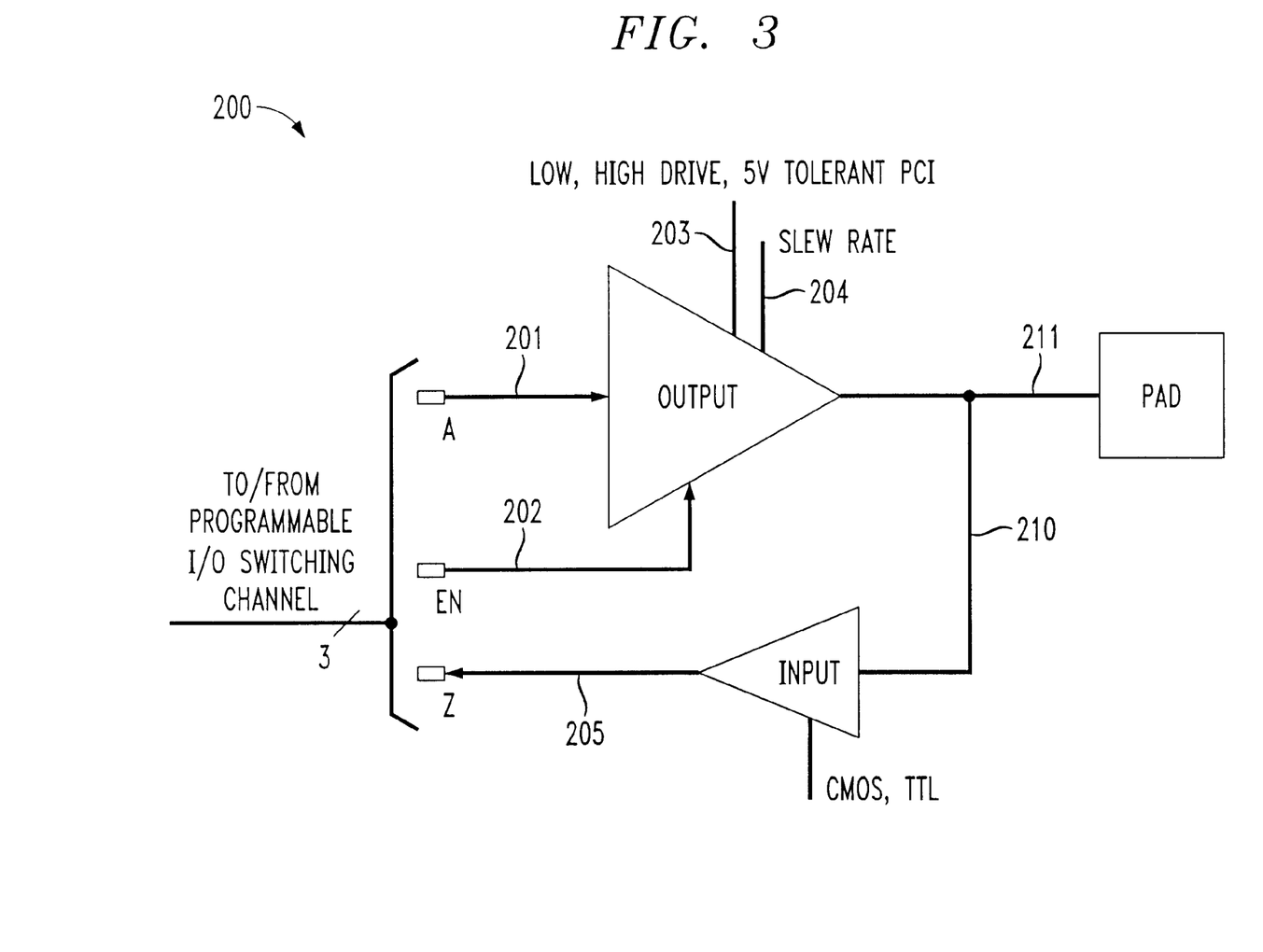
FIG. 3 shows a block diagram of a configurable buffer circuit according to an exemplary embodiment of the present invention.
Figure 4:
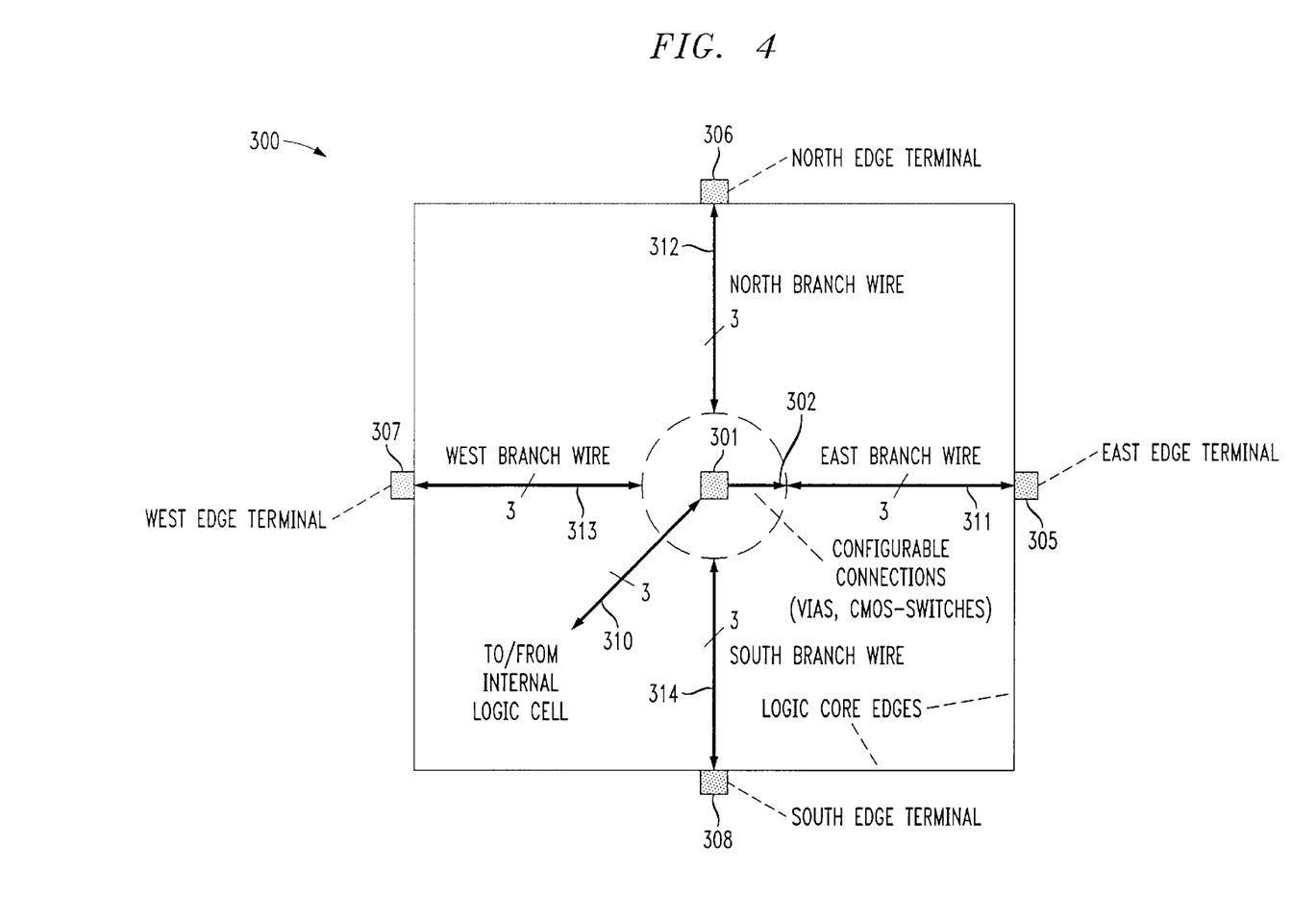
FIG. 4 shows a block diagram of a star cell switch circuit according to an exemplary embodiment of the present invention.

FIG. 3 shows a configurable buffer circuit 200 according to an exemplary embodiment of the present invention. The configurable buffer 200 includes a first input 201 (labeled A), an "enable" input 202 (labeled EN), a supply voltage input terminal 203, a slew rate input terminal 204 ("slew rate" is that rate at which the output of the buffer 200 can be driven one limit to another over its dynamic range), and an output terminal 205 (labeled Z). The output of the configurable buffer 200 is coupled to the output terminal 205 through a first output line 210 which includes an additional buffer for adjusting the output at terminal 205 to coincide with either of the Transistor-Transistor Logic (TTL) and Complementary Metal-Oxide Semiconductor Field Effect Transistor (MOSFET) (commonly referred to as CMOS) schemes. A second output line 211 is coupled to a pad (pin) of a semiconductor device (e.g., semiconductor device 100 of FIG. 2). In the FIG. 2 semiconductor device 100, fourteen (14) such configurable buffers 200 would be required (the two remaining pins being used for power and ground connections), one for each of the input/output (I/O) pins of the device (e.g., seven in interface circuit 140, and seven in interface circuit 150). FIG. 4 shows a star cell switch circuit 300 according to an exemplary embodiment of the present invention. The star cell switch 300 includes a first input/output terminal 301, disposed centrally. The star cell switch 300 also includes a second input/output terminal 305 (labeled east edge terminal), a third input/output terminal 306 (labeled north edge terminal), a fourth input/output terminal 307 (labeled west edge terminal), and a fifth input/output terminal 308 (labeled south edge terminal) disposed around the periphery of the switch. The star cell switch 300 also includes a first input/output line 310 which is preferably coupled to logic circuitry (e.g., logic circuitry 130 in FIG. 2) and the first input terminal 301. Further, the star cell switch 300 includes a second input/output line 311 (coupled between the second input/output terminal 305 and the first input terminal 301), a third input/output line 312 (coupled between the third input/output terminal 306 and the first input terminal 301), a fourth input/output line 313 (coupled between the fourth input/output terminal 307 and the first input terminal 301), and a fifth input/output line 314 (coupled between the fifth input/output terminal 308 and the first input terminal 301). Each of the input/output lines 310–314 preferably comprises at least three lines (wires). Further, one of the input/output lines 311–314 are preferably coupled to the first input terminal 201 (labeled A), the "enable" input terminal 202, and the output terminal 205 (A, EN, and Z), respectively, of each configurable buffer 200. In the FIG. 2 semiconductor device 100, fourteen (14) such star cell switches 300 would be required, one for each of the pins of the device (e.g., seven in interface circuit 140, and seven in interface circuit 150).

The operation of the star cell switch 300 is as follows. Signals are coupled to and from logic circuitry (e.g., logic circuitry 130) to the first input/output terminal 301 through first input/output line 310. The signals are routed to a particular input/output terminal (e.g., 305–308) depending on the position of the central switch 302. In the star cell switch 300 shown in FIG. 4, signals will be routed to the first input/output terminal 305. The central switch 302 is configurable at the time of manufacture of the semiconductor device 100, so that a particular direction is chosen for the signals. The input/output terminal (305–308) to which the switch 302 is directing signals (terminal 305 in FIG. 2) is preferably coupled to the A, EN and Z terminals of a buffer 200, but the remaining terminals (306–308 in FIG. 2) are not coupled to any other circuitry.

As explained above, each pin on the semiconductor device 100 preferably includes at least one configurable buffer 200 and at least one star cell switch 300 associated therewith. In the exemplary embodiment, the buffer 200 and star cell switch 300 are preferably disposed in close proximity to the associated pin. As shown in FIG. 2, this would mean at least fourteen (14) buffers 200 and at least fourteen (14) star cell switches 300 (e.g., seven in interface circuit 140, and seven in interface circuit 150). Depending on the relative positions of functional circuits within the logic circuitry 130, each buffer 200 and each star cell switch 300 associated with a particular pin are configured during manufacture of the semiconductor device 100. For example, when producing a device with resetting circuitry disposed on the 'north' side of the logic circuitry 130, and where it is desired that pin 16 (FIG. 2) be the "reset" pin, the star cell switch 300 for pin 16 is preferably configured so that central switch 302 thereof is disposed in the 'north' position, and so that the A, EN and Z terminals of the associated buffer 200 are coupled to the 'north' terminal of the star cell switch. As will become apparent, the "north" position of the star cell switch 300 is utilized since pin 16 is located below the logic circuitry 130 on the semiconductor die, and therefore, a line coupling pin 16 to the resetting circuitry of the logic circuitry 130 must be directed upwards toward the resetting circuitry location within the logic circuitry. Of course it should be noted that the above configuration is only exemplary, and that the position chosen (e.g., "north", "south", "east", or "west") for a star cell switch 300 will always depend on the relative locations of the logic circuitry and the selected pin.

Figure 5:
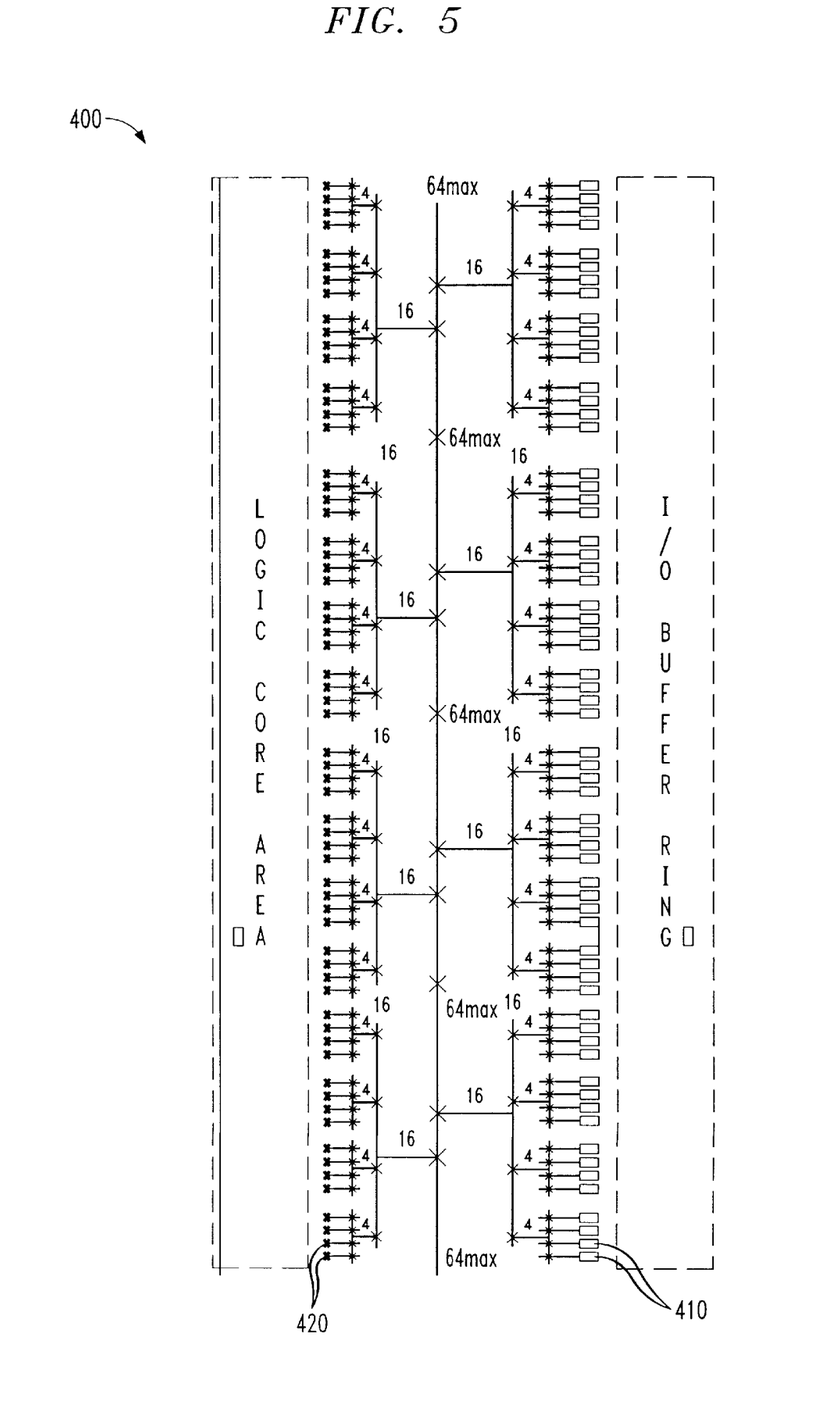
FIG. 5 shows an arrangement for distributing coupling circuitry according to an exemplary embodiment of the present invention.

FIG. 5 shows a coupling network 400 according to an exemplary embodiment of the present invention. It has been described above that at least one buffer 200 and at least one star cell switch 300 are required to couple each pin of the semiconductor device 100 to the logic circuitry 130. A coupling network 400 is also required, to couple the respective star cell switches 300 to the logic circuitry 130. The arrangement 400 shown in FIG. 4 represents a scheme for coupling sixty four (64) pins 410 of a semiconductor device to sixty four (64) logic circuitry locations 420. As can be seen, any one of the sixty four pins 410 may be coupled to any one of the sixty four logic circuitry locations 420, thereby providing a means for configuring the semiconductor device 100.

Figure 6:
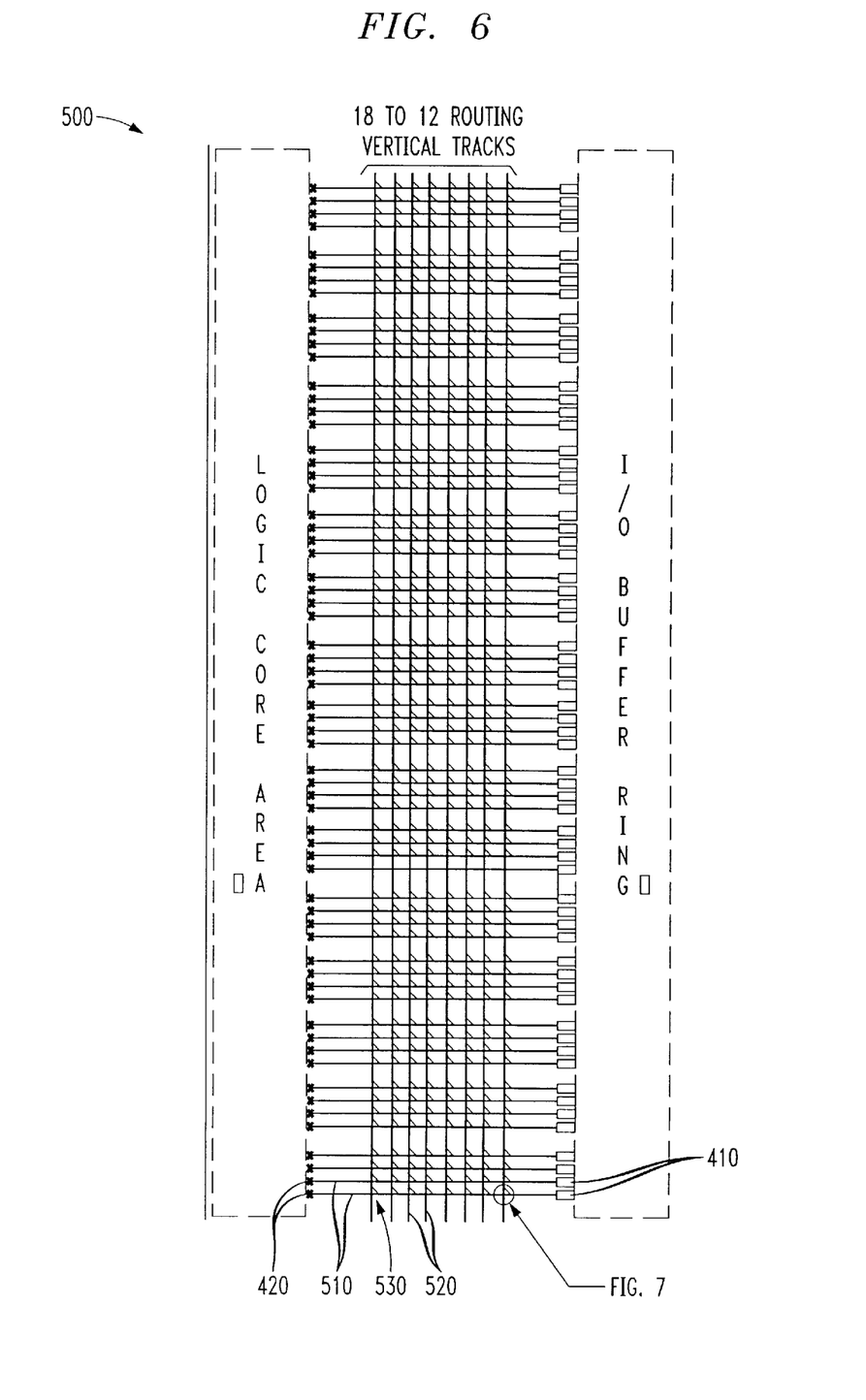
FIG. 6 shows actual coupling circuitry according to an exemplary embodiment of the present invention.

FIG. 6 shows a particular coupling circuit 500 according to an exemplary embodiment of the present invention. The coupling circuit 500 includes a plurality (sixty four in FIG. 6) of horizontal coupling lines 510 and a plurality (eight in FIG. 6) of vertical coupling lines 520. The horizontal coupling lines 510 couple each pin 410 to each logic circuitry location 420 directly. The vertical coupling lines, alternatively, create couplings between the horizontal coupling lines 510. Although there are only eight (8) vertical coupling lines 520 are shown in FIG. 6, it should be noted that there may be any number of such coupling lines, but preferably somewhere between eight (8) and twelve (12) such coupling lines. Additionally, at the junction between each horizontal coupling line 510 and vertical coupling line 520, there exists a coupling member 530 for coupling between the lines. The details of the coupling member are described below with reference to FIG. 7.

Figure 7:
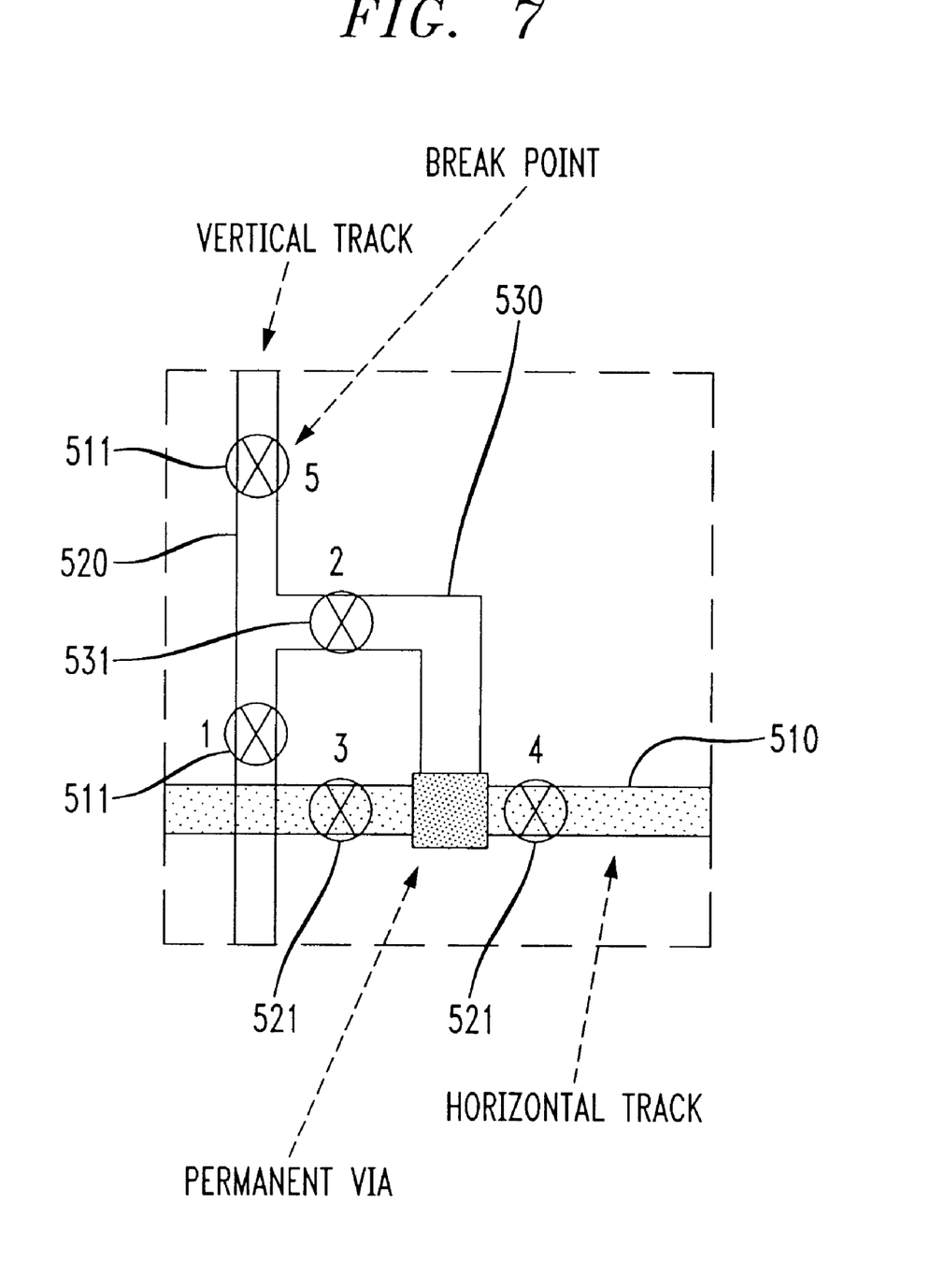
FIG. 7 shows a detail of the coupling circuitry shown in FIG. 6.

FIG. 7 shows a detail of the intersection of one of the horizontal coupling lines 510 and one of the vertical coupling lines 520 of the coupling circuit 500 shown in FIG. 6. As can be seen, a substantially L-shaped coupling member 530 couples the horizontal coupling line 510 to the vertical coupling line 520. Each of the horizontal coupling line 510, the vertical coupling line 520, and the L-shaped coupling member 530 also include a plurality of break points 511 (labeled "1" and "5"), 521 (labeled "3" and "4") and 531 (labeled "2"), respectively. The break points 511, 521, 531 may be removed during manufacture of the semiconductor device 100 to allow signals flow only in a direction specified by the manufacturer. For example, when connecting one of the sixty four pins 410 (e.g. pin 64) to any one of the logic circuitry locations 420 (e.g., location 0), any breaks 511, 521, 531 which would allow the signal to diverge from the exact path (from pin 64 to location 0) would be removed during manufacture.

Although the coupling circuit 500 includes removable break points 511, 521, and 531 which assist in forming the connections between the logic circuitry 130 and the pins 120 of the semiconductor device 100, it should be noted by those skilled in the art that transistors (e.g., MOSFETs) may be utilized to create and disable the connections between the logic circuitry 130 and the pins 120 of the semiconductor device 100.

Thus, by utilizing interface circuits 140, 150 which include configurable buffers 200, star cell switches 300, and coupling circuits 500 as described above, a configurable semiconductor device 100 may be fabricated. Such a configurable semiconductor device 100 allows many different types of integrated circuits to be formed using a single structure. In particular, the settings of the different elements of the interface circuits 140, 150 are set at the time of manufacture depending on the relative positions of functional circuits within the logic circuitry 130, and a particular pin arrangement.

There are a number of ways that the configuration of the buffers 200, star cell switches 300, and coupling circuits 500 can be accomplished at the time of manufacture of the semiconductor device 100. They include: custom metallization via a metal mask (large scale production), laser programming (where a trimmable star cells and coupling circuit designs are implemented), and software programming (where programmable buffers and star cells are used).

The present application has particular use in applications which require a semiconductor device be housed in multiple-pin packages (e.g., 100-pin, 144-pin, or 256-pin packages), and which support multiple interfaces (e.g., PCI bus interface and Synchronous Dynamic Random Access Memory (SDRAM) interfaces). For example, in a 100-pin embodiment, the SDRAM interface signal pins are removed from the pinout, and instead, those pins are used for PCI interface. This method provides a solution which will meet the electrical requirements that the PCI pins be grouped together. The groupings are critical in meeting the PCI pc-board trace compliance. The groupings also help to prevent potential noise coupling problems between signal pins with different electrical characteristics.

Figure 8:
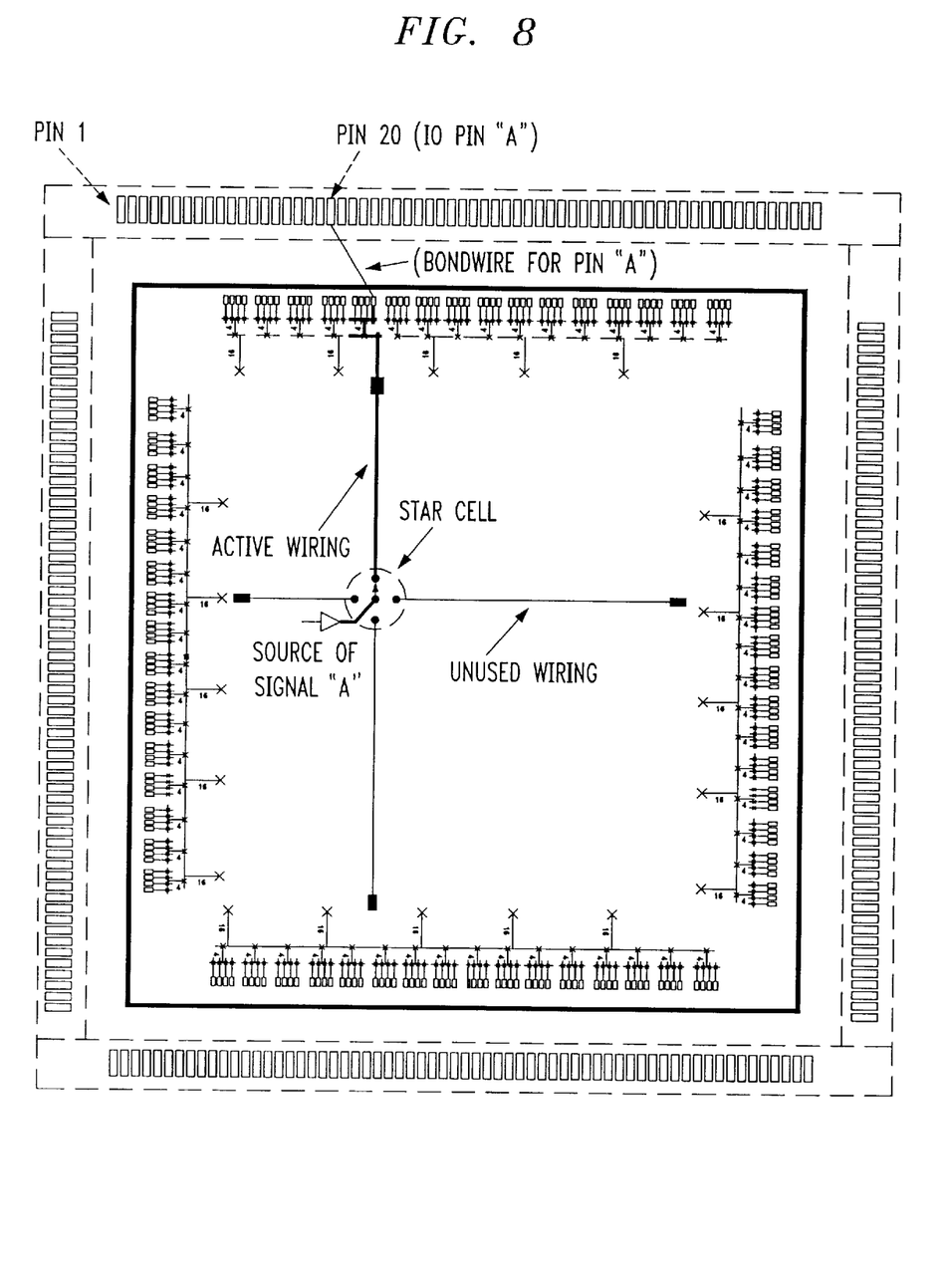
FIG. 8 shows an example configuration for a 256 pin package.

FIG. 8 shows an example configuration for a 256 pin package. The example shows that pin 20 of the package is chosen for the input/output terminal A (see, e.g., first input 201; FIG. 3). As shown, pin 20 of the package is coupled to pin 20 of the semiconductor device by a bondwire. Then, pin 20 of the semiconductor device is coupled to a star cell switch (e.g., star cell switch 300) via an "active" line of a coupling network (e.g., coupling circuit 500). In the particular example, the star cell is configured in its "north" position. The star cell is then coupled to logic circuitry (e.g., logic circuitry 130) via a configurable buffer (e.g., buffer 200), as explained above with reference to FIGS. 3 and 4.

Figure 9:
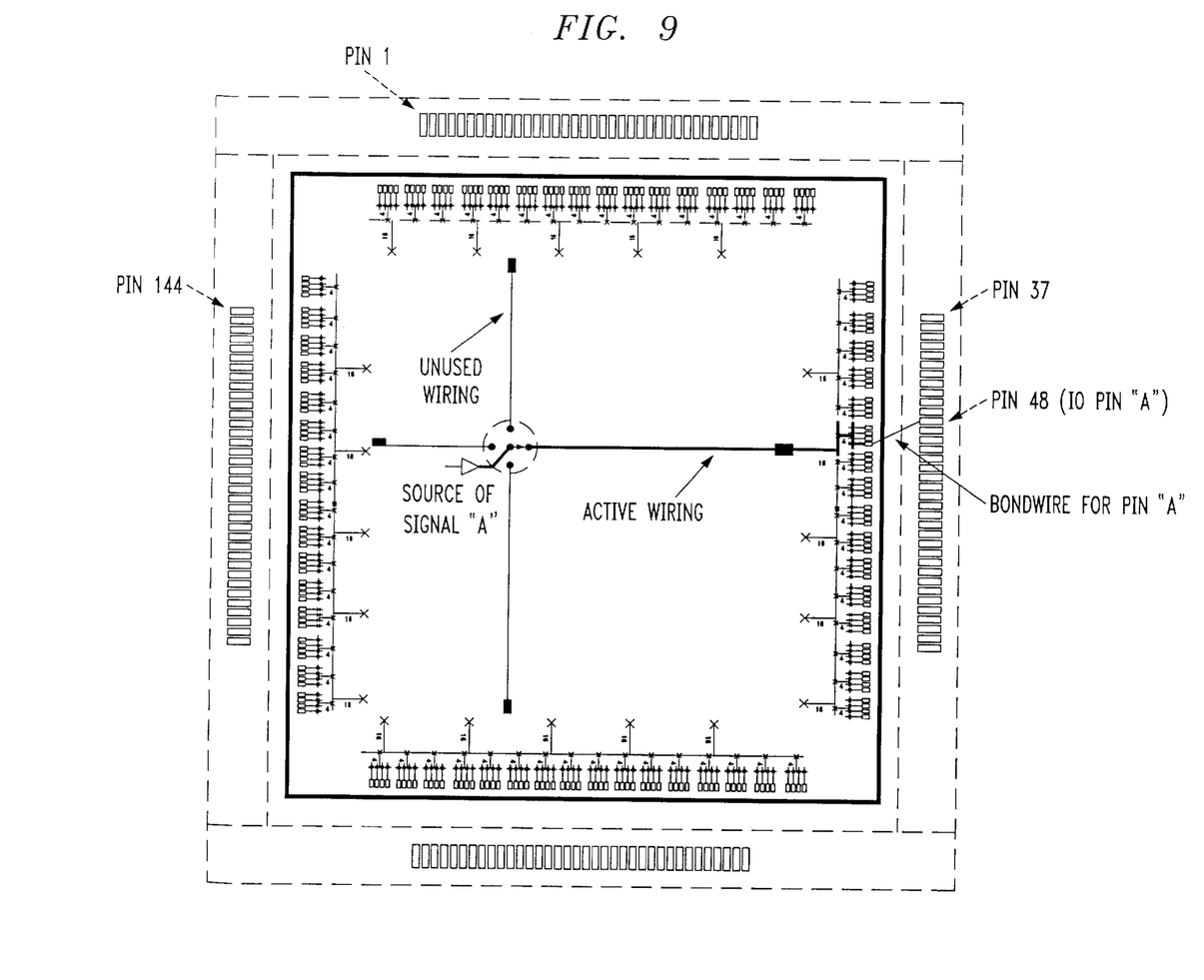
FIG. 9 shows an example configuration for a 144 pin package.

FIG. 9 shows an example configuration for a 144 pin package. The example shows that pin 48 of the package is chosen for the input/output terminal A (see, e.g., first input 201; FIG. 3). As shown, pin 48 of the package is coupled to pin 48 of the semiconductor device by a bondwire. Then, pin 48 of the semiconductor device is coupled to a star cell switch (e.g., star cell switch 300) via an "active" line of a coupling network (e.g., coupling circuit 500). In the particular example, the star cell is configured in its "east" position. The star cell is then coupled to logic circuitry (e.g., logic circuitry 130) via a configurable buffer (e.g., buffer 200), as explained above with reference to FIGS. 3 and 4.

The essence of the present invention is that the semiconductor device 100 can be placed into different packages, without completely changing the mask set. Instead of changing the mask set, the semiconductor device 100 may be altered by the methods described above to accommodate many types of packages and environments.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A semiconductor device comprising:
   logic circuitry;
   a plurality of pins; and,
   an interface unit coupling the logic circuitry to the plurality of pins, wherein the interface unit permits any of the pins to be coupled to any portion of the logic circuitry, wherein the interface unit comprises:
      at least one buffer coupled to one of the plurality of pins;
      at least one multidirectional switch coupled to the at least one buffer; and,
      at least one coupling network coupling the at least one multidirectional switch to the logic circuitry.

2. The semiconductor device of claim 1, wherein the at least one buffer comprises a configurable buffer with at least one input, at least one output, and at least one configurable terminal.

3. The semiconductor device of claim 1, wherein the multidirectional switch comprises a star cell switch with at least four different switch positions.

4. The semiconductor device of claim 1, wherein the coupling network comprises a plurality of first coupling lines corresponding to the plurality of pins, and at least one second coupling line which intersects said first coupling lines.

5. The semiconductor device of claim 2, wherein the at least one buffer additionally comprises at least one enable terminal.

6. The semiconductor device of claim 2, wherein the at least one configurable terminal comprises a slew rate control terminal.

7. The semiconductor device of claim 2, wherein the at least one configurable terminal comprises a Transistor-Transistor Logic/Complementary Metal-Oxide Semiconductor Field Effect Transistor control terminal.

8. The semiconductor device of claim 4, wherein at least one of the plurality of first coupling lines includes at least one removable break point.

9. The semiconductor device of claim 4, wherein the at least one second coupling line includes at least one removable break point.

10. The semiconductor device of claim 4, further comprising:

a coupling member coupling at least one of said plurality of first coupling lines and said at least one second coupling line.

11. The semiconductor device of claim 10, wherein the coupling member is L-shaped.

12. A configurable integrated circuit comprising:

logic circuitry;

a plurality of pins; and, an interface unit coupling the logic circuitry to the plurality of pins, wherein the interface unit permits any of the pins to be coupled to any portion of the logic circuitry, wherein the interface unit comprises:

at least one buffer coupled to one of the plurality of pins;

at least one multidirectional switch coupled to the at least one buffer; and, at least one coupling network coupling the at least one multidirectional switch to the logic circuitry.

\* \* \* \* \*